US 6,370,680 B1

United States Patent
Nguyen

(10) Patent No.: US 6,370,680 B1
(45) Date of Patent: Apr. 9, 2002

(54) DEVICE TO DETERMINE LINE EDGE ROUGHNESS EFFECT ON DEVICE PERFORMANCE

(75) Inventor: Khanh B. Nguyen, San Mateo, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/289,841

(22) Filed: Apr. 12, 1999

(51) Int. Cl.$^7$ ................................................ G06F 17/50
(52) U.S. Cl. ............................................................ 716/19
(58) Field of Search ........................ 257/330; 438/260; 716/5, 9, 19, 10

(56) References Cited

U.S. PATENT DOCUMENTS 6,008,521 A * 12/1999 Gardner ....................... 257/330
6,136,652 A * 10/2000 Hazani ........................ 438/260

* cited by examiner

*Primary Examiner*—Matthew Smith
*Assistant Examiner*—Thuan Do
(74) *Attorney, Agent, or Firm*—Eschweiler & Associates, LLC (57) ABSTRACT

A structure (300) for determining an amount of line edge roughness (LER) on a patterned feature (310) includes a plurality of source regions (304) and drain regions (306) formed in a semiconductor substrate (303), with each of the source and drain regions (304, 306) having a channel (320) therebetween. The source regions (304) are electrically isolated from each other and the drain regions (306) are electrically isolated from each other, respectively. The patterned feature of interest (310) is formed over a gate oxide, extends over the channels (320) in a direction which is transverse to the source regions (304) and the drain regions (306), and forms a common gate (310) for a plurality of transistors (302a–302n) formed with the plurality of source regions (304) and drain regions (306). The plurality of transistors (302a–302n) are activated to conduct current therethrough by placing a predetermined voltage on the common gate (310) and the currents of the plurality of transistors (302a–302n) are used to determine the line edge roughness (LER) of the patterned feature 310.

17 Claims, 9 Drawing Sheets

DEVICE TO DETERMINE LINE EDGE ROUGHNESS EFFECT ON DEVICE PERFORMANCE

FIELD OF THE INVENTION

The present invention generally relates to semiconductor devices, and more particularly relates to a device and method for determining the line edge roughness effect of individual features on device performance.

BACKGROUND OF THE INVENTION

Lithography in semiconductor processing relates generally to the process of transferring patterns which correspond to desired circuit components onto one or more thin films which overlie a substrate. One important step within the field of lithography involves optical tools and methods for transferring the patterns to the films which overlie the semiconductor wafer. Patterns are transferred to a film by imaging various circuit patterns onto a photoresist layer which overlies the film on the wafer. This imaging process is often referred to as "exposing" the photoresist layer. The benefit of the exposure process and subsequent processing allows for the generation of the desired patterns onto the film on the semiconductor wafer, as illustrated in prior art FIGS. 1a–1f.

Figure 1A:
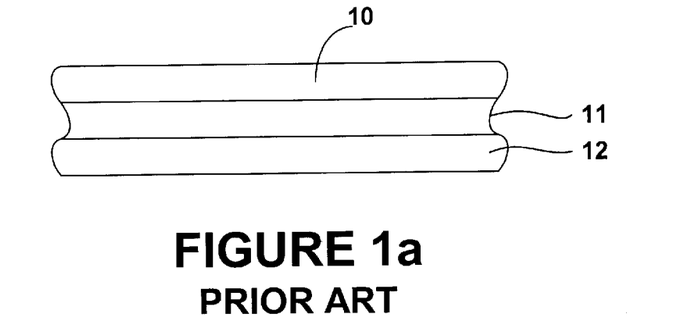
FIG. 1a is a fragmentary cross section illustrating a prior art semiconductor substrate having a film overlying the substrate which in turn is covered by a photoresist layer.
Figure 1B:
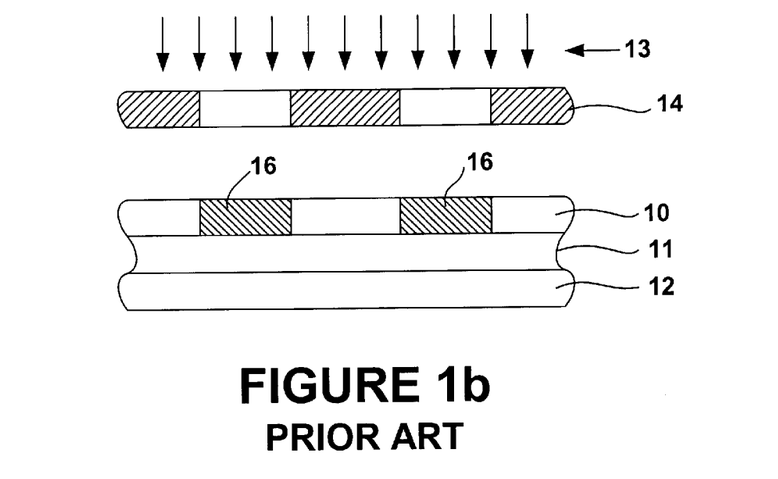
FIG. 1b is a fragmentary cross section illustrating a prior art method of selectively exposing a photoresist layer using a mask.
Figure 1C:
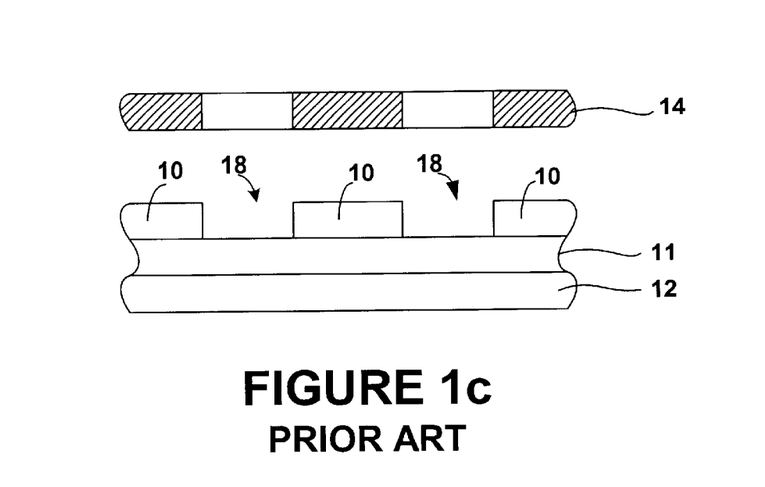
FIG. 1c is a fragmentary cross section illustrating a positive photoresist layer after being developed.
Figure 1D:
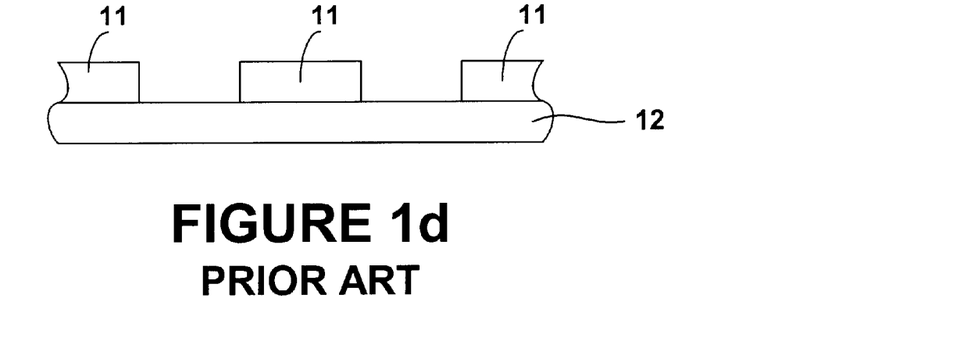
FIG. 1d is a fragmentary cross section illustrating a transfer of a mask pattern to the film.
Figure 1E:
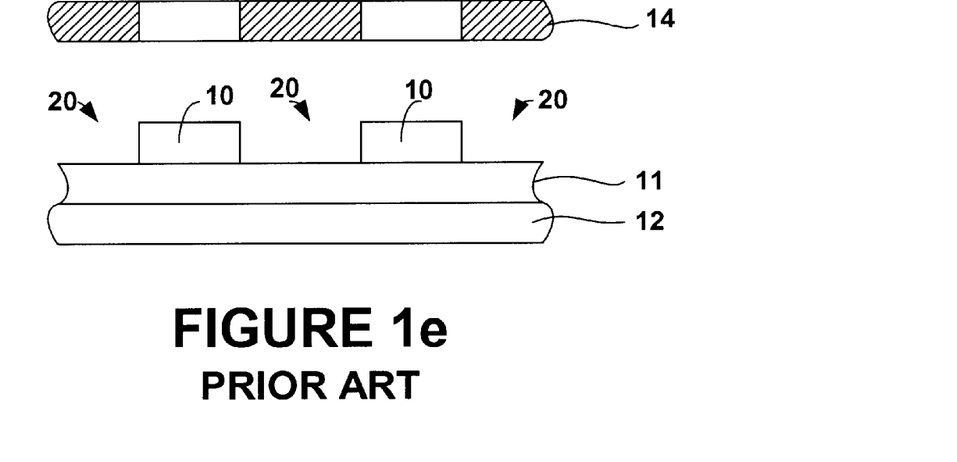
FIG. 1e is a fragmentary cross section illustrating a negative photoresist layer after being developed.
Figure 1F:
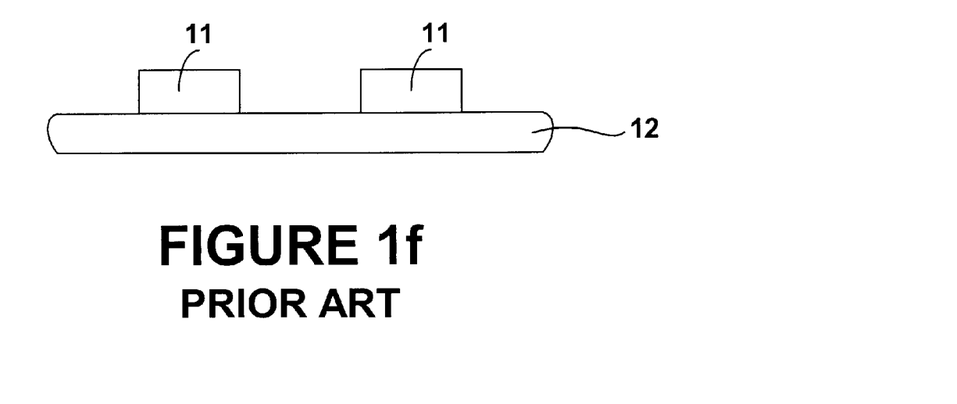
FIG. 1f is a fragmentary cross section illustrating a transfer of a mask pattern to the film.

Prior art FIG. 1a illustrates a photoresist layer 10 deposited by, for example, spin-coating, on a thin film 11 such as, for example, silicon dioxide ($SiO_2$) which overlies a substrate 12 such as silicon. The photoresist layer 10 is then selectively exposed to radiation 13 (e.g., ultraviolet (UV) light) via a photomask 14 (hereinafter referred to as a "mask") to generate one or more exposed regions 16 in the photoresist layer 10, as illustrated in prior art FIG. 1b. Depending on the type of photoresist material utilized for the photoresist layer 10, the exposed regions 16 become soluble or insoluble in a specific solvent which is subsequently applied across the wafer (this solvent is often referred to as a developer).

The exposed regions 16 are made either soluble or insoluble in the developer. When the exposed regions 16 are made soluble, a positive image of the mask 14 is produced in the photoresist layer 10, as illustrated in prior art FIG. 1c, and the photoresist material is therefore referred to as a "positive photoresist". The exposed underlying areas 18 in the film 11 may then be subjected to further processing (e.g., etching) to thereby transfer the desired pattern from the mask 14 to the film 11, as illustrated in prior art FIG. 1d (wherein the photoresist layer 10 has been removed). Conversely, when the exposed regions 16 are mode insoluble, a negative image of the mask 14 is produced in the photoresist 10 layer, as illustrated in prior art FIG. 1e, and the photoresist material is therefore referred to as a "negative photoresist". In a similar manner, the exposed underlying areas 20 in the film 11 may then be subjected to further processing (e.g., etching) to thereby transfer the desired pattern from the mask 14 to the film 11, as illustrated in prior art FIG. 1f.

The transfer of patterns to the photoresist layer 10 as discussed above involves the use of optical aligners. Optical aligners are machines which contain a variety of subsystems that work together to form the imaging function. Such optical aligners include: (1) an illumination source which provides the optical energy (UV light in the above example) for transforming the photoresist via exposure, (2) an optical subsystem that focuses the circuit patterns onto the photoresist surface and allows for controlled exposure times, and (3) and a movable stage that holds the wafer being exposed.

Historically, three primary methods have been used to optically transfer a mask pattern to a photoresist covered film. These methods are: contact printing, proximity printing and projection printing and are illustrated in simplified form in prior art FIGS. 2a–2d, respectively. Contact printing 100, as illustrated in prior art FIG. 2a, was the earliest method used to produce patterns. Contact printing 100 involves a light source 112, an optical system 114, a mask 116 and a photoresist layer 118 overlying a thin film 119 (not shown) which, in turn, overlies a semiconductor wafer 120. The mask 1 16, which contains the desired circuit patterns for transfer to the photoresist layer 118, is positioned (aligned) relative to any existing patterns that already existed on the wafer 120. The mask 116 is then clamped down to the photoresist layer 118, thereby making physical contact with the photoresist layer 118, and exposed with ultraviolet (UV) light from the light source 112. This method provides for an excellent image transfer and good resolution (i.e., good minimum linewidth spacing).

Figure 2A:
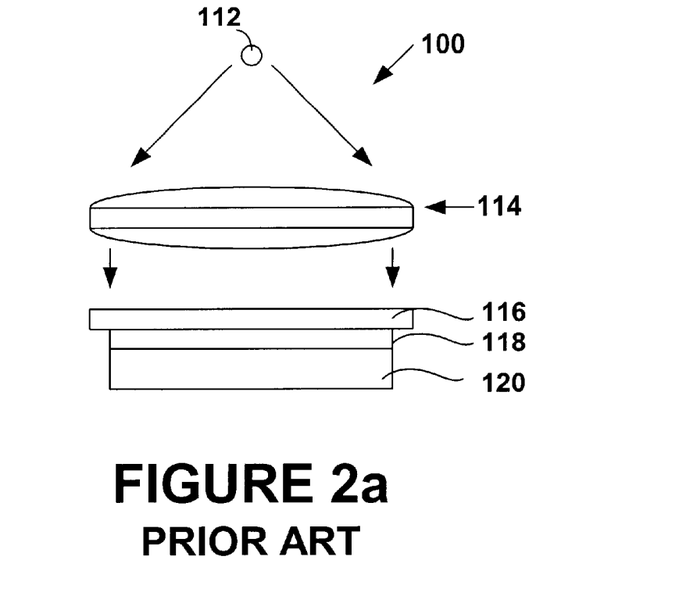
FIG. 2a is system view of a prior art contact printing system wherein a mask physically contacts the wafer during transfer of a pattern to the wafer.

Contact printing, however, suffers from the direct contact made between the mask 116 and the photoresist layer 118. The repeated contact made between the mask 116 and the photoresist layer 118 in the process results in defects generated in the mask 116 which are then reflected in the transfer made on subsequently processed wafers. To prevent this problem, the masks 116 must be disadvantageously inspected and cleaned regularly. In addition, small particles may be caught between the mask 116 and the photoresist layer 118 when affixing the two elements, thereby preventing the desired direct contact between the mask 116 and the photoresist layer 118. This particulate contamination results in reduced resolution in the area local to the foreign particle. Consequently, contact printing is not common in VLSI semiconductor manufacturing.

Figure 2B:
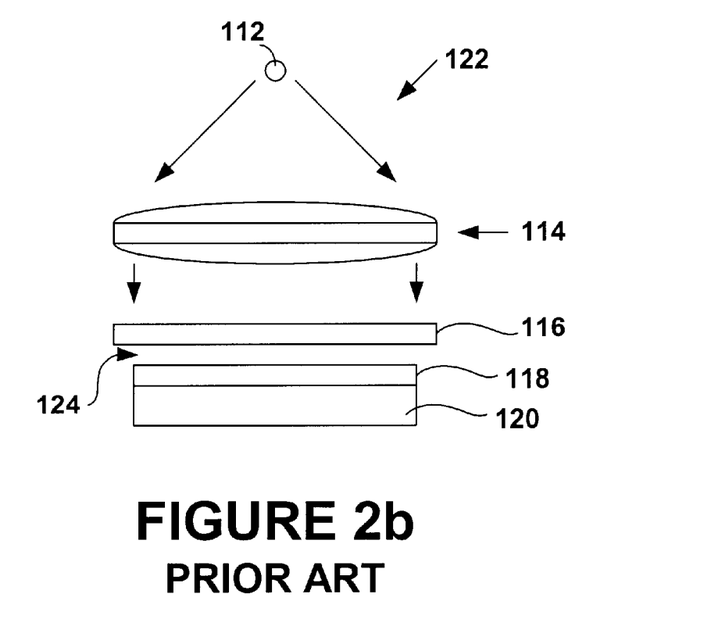
FIG. 2b is a system view of a prior art proximity printing system wherein a mask is separated from the underlying wafer by a gap during transfer of a pattern to the wafer.

Proximity printing 122, as illustrated in prior art FIG. 2b, involves placing the mask 116 near the wafer 120 (which is covered with the photoresist 118) during exposure, however, the mask 116 and the wafer 120 do not make contact. By introducing a gap 124 between the mask 116 and the wafer 120, the defect problem of contact printing is substantially avoided. Unfortunately, as the gap 124 increases, the resolution of the proximity printing system 122 rapidly deteriorates. For example, a 10 $\mu$m gap with a 400 nm exposure (the wavelength of the light source 112) results in a minimum resolution of about 3 $\mu$m. In addition, proximity printing 122 requires extremely flat masks 116 and wafers 120 in order to prevent gap variations spatially about the wafer 120. Since many VLSI semiconductor circuits today require features of 0.25 $\mu$m or less, proximity printing 122 is not considered adequate for many VLSI semiconductor manufacturing operations.

Projection printing is a generic term that encompasses various pattern transfer techniques. These techniques, for example, include: (a) projection scanning systems, (b) reduction (e.g., 4×or 10×) step-and-repeat projection systems and (c) reduction step-and-scan systems. In each system, lens elements or mirrors are used to focus the mask image on the wafer surface (containing the photoresist).

Figure 2C:
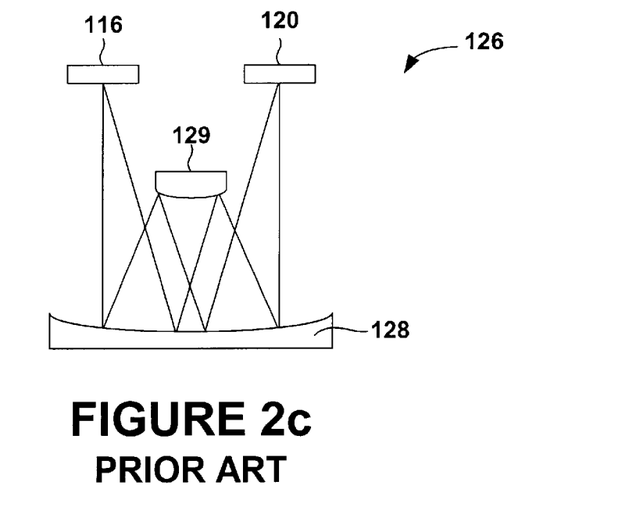
FIG. 2c is a system view of a prior art scanning projection system wherein reflective optics are used to transfer a pattern to the wafer.

Projection scanning systems (often called scanning projection aligners), use a reflective spherical mirror (reflective optics) to project an image onto the wafer surface, as illustrated, for example, in prior art FIG. 2c. The system 126 includes a primary mirror 128 and a secondary mirror 129 which are arranged with the mask 116 and the wafer 120 to image the mask pattern onto the photoresist layer 118 which overlies the film 119 on the wafer 120 (the photoresist layer 118 and the thin film 119 are not shown in FIG. 2c for simplicity). A narrow arc of radiation is imaged from the mask 116 to the wafer 120 with light that travels an optical path that reflects the light multiple times. The mask 116 and the wafer 120 are scanned through the arc of radiation by means of a continuous scanning mechanism (not shown). The scanning technique minimizes mirror distortions and aberrations by keeping the imaging illumination in the "sweet spot" of the imaging system 128 and 129.

Figure 2D:
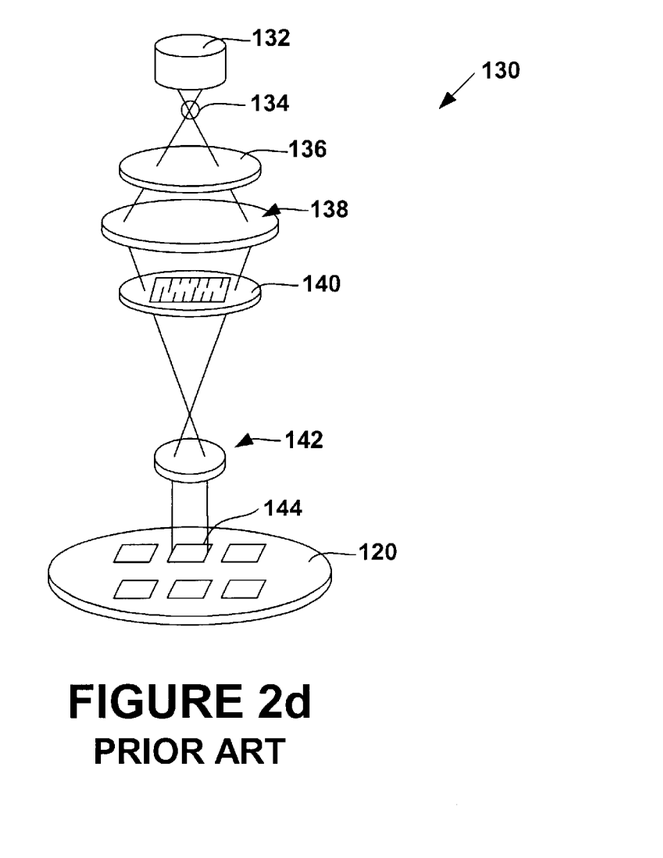
FIG. 2d is a system view of a prior art reduction stepper wherein refractive optics are used to transfer a pattern to a localized region on the wafer.

Reduction step-and-repeat systems 130 (also called reduction steppers) use refractive optics (as opposed to reflective optics in the system 126 of prior art FIG. 2c) to project the mask image onto the photoresist layer 118 which overlies the film 119 on the wafer 120, as illustrated, for example, in prior art FIG. 2d. The reduction stepper 130 includes a mirror 132, a light source 134, a filter 136, a condenser lens system 138, a reticle 140, a reduction lens system 142 and the wafer 120. The mirror 132 behaves as a collecting optics system to direct as much of the light from the light source 134 (e.g., a mercury-vapor lamp) to the wafer 120. The filter 136 is used to limit the light exposure wavelengths to the specified frequencies and bandwidth. The condenser system 138 focuses the radiation through the reticle 140 and to the reduction lens system to thereby focus a "masked" radiation exposure onto a limited portion of the wafer 120, namely onto a single semiconductor die 144.

Since it is complex and expensive to produce a lens capable of projecting a mask pattern of an entire 150 mm or 200 mm wafer, the refractive system 130, as illustrated in prior art FIG. 2d, projects an image only onto a portion of the wafer 120 corresponding to an individual semiconductor die 144. This image is then stepped and repeated across the wafer 120 in order to transfer the pattern to the entire wafer (and thus the name "steppers"). Consequently, the size of the wafer is no longer a consideration for the system optics.

The reduction stepper system 130 thus uses the reticle 140 instead of a mask. Reticles are similar to masks, but differ in that a mask contains a pattern for transfer to the entire wafer in one exposure while a reticle contains a pattern image for a single or several semiconductor die that must be stepped and repeated across the wafer 120 in order to expose the entire wafer substrate. Today, however, the terms "mask" and "reticle" are used interchangeably. Current reduction stepper systems such as the system 130 utilize reticles that contain a pattern that is an enlargement of the desired image on the wafer 120. Consequently, the reticle pattern is reduced when projected onto the wafer 120 during exposure (and thus the name "reduction stepper").

One advantage of stepper technology over the full wafer scanning type technology is higher image resolution (i.e., smaller minimum linewidths). In addition, stepping each die on the wafer 20 allows compensation for wafer distortion. Further still, reduction steppers provide good overlay accuracy. Steppers do, however, exhibit reduced throughput (number of wafers/hour) and require precision control of the mechanical stage (not shown) which holds the wafer 120. The advantages of reduction steppers, however, presently outweigh their disadvantages and thereby make reduction steppers quite popular in the manufacture of VLSI semiconductors with minimum linewidths less than 1 $\mu$m.

Figure 3:
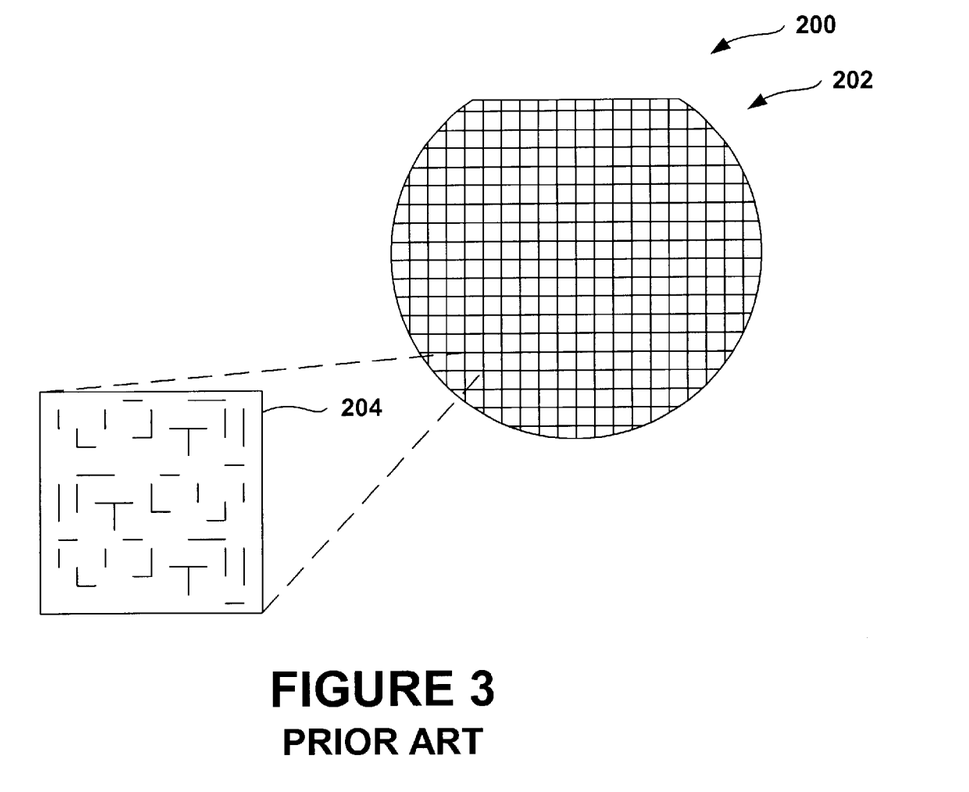
FIG. 3 is a plan view of a processed semiconductor wafer having an individual die with patterned features thereon highlighted in an amplified view.
Figure 4:
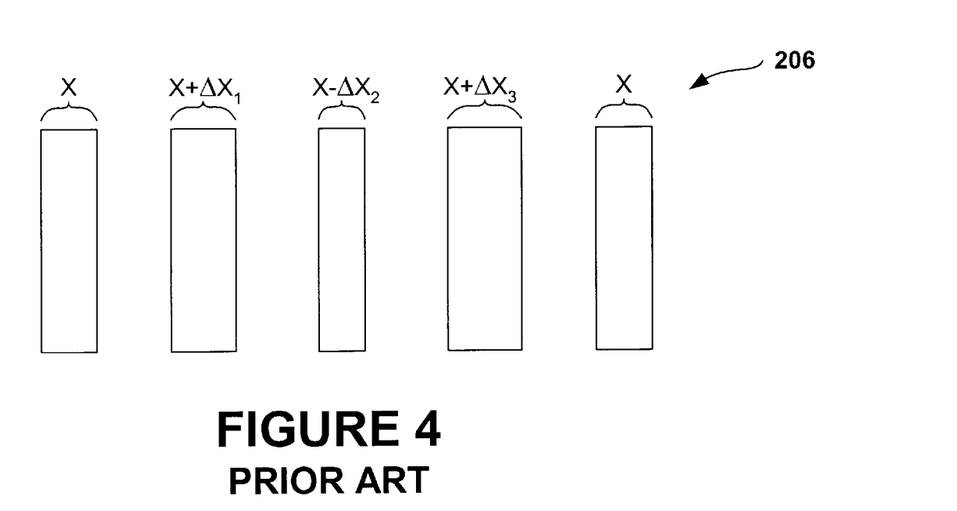
FIG. 4 is a plan view of a plurality of features representing features formed on the die of FIG. 3, wherein some of the features have linewidths which vary from the nominal, target value.

The goal of a high performance lithography system is to provide a high resolution, repeatable system which reduces the linewidth of features produced thereby. In addition to providing small, repeatable linewidths, it is also desirable to provide linewidth uniformity across the image field. That is, it is desirable to provide a lithography system in which a designer can expect the linewidth of various features across the image field to fall within a predetermined range of a nominal, target value (i.e., X±ΔX). Prior art FIG. 3 illustrates a plan view of a processed semiconductor wafer 200 having a plurality of die 202 thereon, wherein one of the die 204 is amplified to show a plurality of features thereon which were formed by the lithography system of interest. For a step and repeat type system, the image field typically encompasses the entire semiconductor die 204. For example, as illustrated in prior art FIG. 4, which illustrates a plurality of similar features 206 across the die 204 of FIG. 3, if the nominal linewidth of a feature is X, system linewidth uniformity would ensure that such features would have a linewidth within ±ΔX of the target value (e.g., about 5%) at any location on the die 204. As lithography systems and processes continue to improve, the average linewidth variation across the image field continues to decrease, thus indicating greater linewidth uniformity.

It is important for lithography developers to ascertain the average linewidth variation ($\Delta X_{AVG}$) across the image field in order to properly characterize and develop new lithography components and processes (e.g., exposure processes, mask materials, photoresists, imaging systems, etc.) to further enhance linewidth uniformity. As linewidths and the average linewidth variation continues to shrink, however, distilling average linewidth variations due to the lithography system from other phenomena becomes increasingly difficult. One such phenomena is called line edge roughness (LER) and refers to the variations on the sidewalls of features.

LER occurs in patterned features and is caused primarily by a corresponding LER within an overlying photoresist which is used as a mask for the patterning of the features. LER in photoresist masks is caused by various factors, including LER on the chrome patterns which reside on the reticle, the image contrast of the system used in generating the photomask pattern, the plasma etch with which the photoresist pattern is formed, the photoresist material properties and the photoresist processing scheme. The LER in the overlying photoresist mask is then transferred into the underlying film (e.g., metal, polysilicon, etc.). In addition to LER in the photoresist mask, the plasma etch used in patterning the underlying film further contributes to the LER of the patterned feature.

Figure 5:
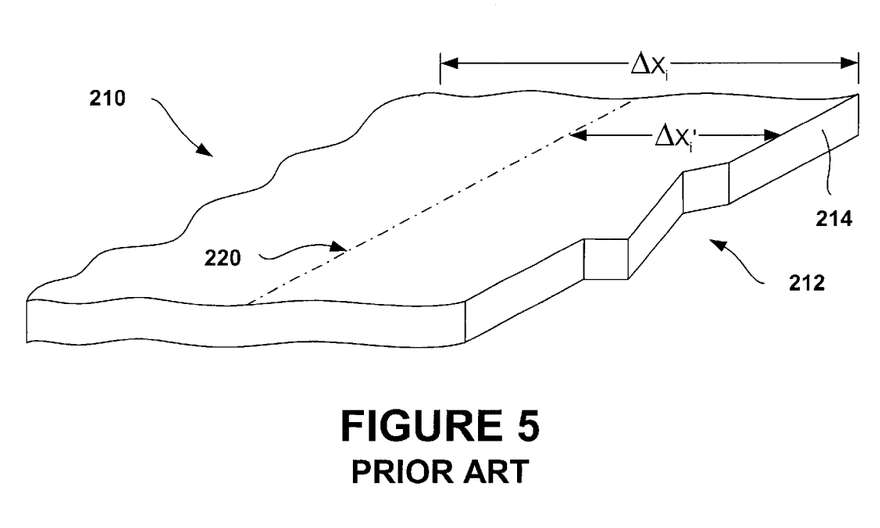
FIG. 5 is a perspective view illustrating line edge roughness (LER) and the impact of LER as linewidth variations continue to decrease.

As feature sizes continue to shrink, the contribution of LER to the entire feature linewidth variation becomes more pronounced and thus it is important to separate or distill the LER from average linewidth variations caused by the lithography system and process. With such information, each component which makes up the entire linewidth variation (i.e., LER and the lithography system) can be separately characterized and processes can be developed to reduce each component. Prior art FIG. 5 is a fragmentary perspective view which illustrates a portion of a feature 210 which represents the variation from the average linewidth (i.e., $\Delta X_i$). The feature 210 has a nonuniformity 212 at a lateral edge 214 which is attributable to LER. Since the feature 210 which represents the linewidth variation from the nominal linewidth is substantially large (e.g., a poor quality lithography process having large linewidth variations), however, the nonuniformity 212 is relatively small with respect thereto and thus may be effectively ignored. In contrast, as illustrated in phantom with the dotted line 220 in prior art FIG. 5, as the linewidth variations become smaller (i.e., $\Delta X_i'$) the nonuniformity 212 is more pronounced with respect to the entire linewidth variation and must be taken into account. More particularly, it is important for the lithography developer to separate LER from average linewidth variations due to the lithography system and process so that subsequent process development can properly focus on each component of linewidth variation separately.

In addition, as device features continue to shrink, LER impacts the process control, for example, causing the channel lengths of various transistors to vary from one another beyond a maximum threshold and thus undesirably resulting in device performance variations. Unfortunately, although prior art methods exist for measuring the LER associated with a given feature (e.g., via an atomic force microscope (AFM) or a scanning electron microscope (SEM)), presently there is no effective way of coupling the LER to the resulting device performance repeatability in order to provide minimum device feature size specifications or quantify whether a particular process provides a sufficiently low LER to meet a given device performance repeatability specification.

SUMMARY OF THE INVENTION

The present invention relates to a structure and related method for determining a line edge roughness (LER) of a patterned feature using device characteristics of multiple devices, wherein the patterned feature is a common component within the devices. The present invention also relates to a structure and method of determining a preferred minimum device dimension based on a determination of the impact of LER on the device performance repeatability.

According to one aspect of the present invention, a structure for determining the line edge roughness of a patterned feature is disclosed. The structure includes a plurality of transistors having the patterned feature as a common gate electrode for the transistors. The transistors are activated using the gate electrode and the conduction current within each of the transistors is a function of the width of the gate electrode immediately overlying each channel region, respectively. The conduction currents of the transistors are measured and used to separate line edge roughness from linewidth variation components due to other types of lithography variables.

The distilling of line edge roughness from other factors is achieved, for example, by calculating an average and a standard deviation of the conduction currents. The average conduction current of the transistors is attributable to the average gate width and can be used to deduce the average linewidth variation of the patterned feature which is associated with other, non-LER process factors. Similarly, the standard deviation of the conduction currents is attributable to the amount of variation of the patterned feature width about its average and is used to deduce the line edge roughness of the patterned feature (i.e., the gate).

According to another aspect of the present invention, a method of separating line edge roughness from other linewidth variation components includes the forming of a plurality of transistors having a common gate electrode which serves as the patterned feature of interest. Each of the transistors are activated to place the transistors in a conducting mode and the conduction current of each transistor is then measured. Using the measured conduction currents, the line edge roughness of the patterned feature is separated from the other linewidth variation components. According to one exemplary aspect of the present invention, the separation is achieved by calculating the average and the standard deviation of the conduction currents, wherein the average current is associated with the linewidth variation attributable to other, non-LER lithography process factors while the standard deviation is associated with the degree of linewidth variation of the gate about its average width and thus is attributable to the line edge roughness of the feature.

According to still another aspect of the present invention, a method of determining a minimum device feature size (e.g., transistor width) based on a predetermined device performance criteria (e.g., repeatability) is disclosed. The method includes forming a plurality of test structures, wherein each of the test structures include a plurality of transistors having a patterned feature (having an LER) as a common gate electrode for the transistors. The transistors within each test structure preferably have the same width, and each of the test structures have transistor widths that differ from each other. The transistors of each test structure are activated using their gate electrode and the conduction current for each of the transistors is then measured. Because each test structure employs transistors having differing widths, the standard deviation of the conduction currents (due to the LER) for each test structure will also differ and reflect the impact of the gate electrode LER on transistor performance repeatability. Based on a predetermined performance repeatability criteria applied to the standard deviation data, one of the test structures is selected. The transistor width of the selected test structure represents the minimum transistor width which may be utilized while maintaining performance variations due to LER that are below a predetermined level. Consequently, the present invention provides a method of establishing a processing design specification which minimizes the impact of LER on device performance repeatability.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

The following is a detailed description of the present invention made in conjunction with the attached Figures, wherein like reference numerals will refer to like elements throughout. The present invention includes a structure and a related method for distilling the line edge roughness (LER) of a patterned feature from other feature linewidth variation components. The structure includes a plurality of transistors having source and drain regions formed in a semiconductor substrate, respectively. Each of the transistors share a common gate electrode which serves as the patterned feature of interest. The common gate electrode overlies the substrate in a direction which is transverse to the source and drain regions and defines a plurality of channel regions therebeneath for each of the transistors. Upon activating the transistors via the common gate electrode, the transistors conduct and the conduction current of each of the transistors is measured and used to separate the LER of the patterned feature from the other feature linewidth variation components.

According to an exemplary embodiment of the present invention, the LER is separated from the other feature linewidth variation components by calculating the average and the standard deviation of the measured conduction currents. The average current is attributable to the average linewidth of the gate electrode across the various transistors and is used to identify the linewidth variation components not associated with the LER. Similarly, the standard deviation of the conduction currents reflects the amount of variation of the currents (and therefore the linewidth of the common gate) from the average current and is used to identify the LER of the patterned features.

Figure 6:
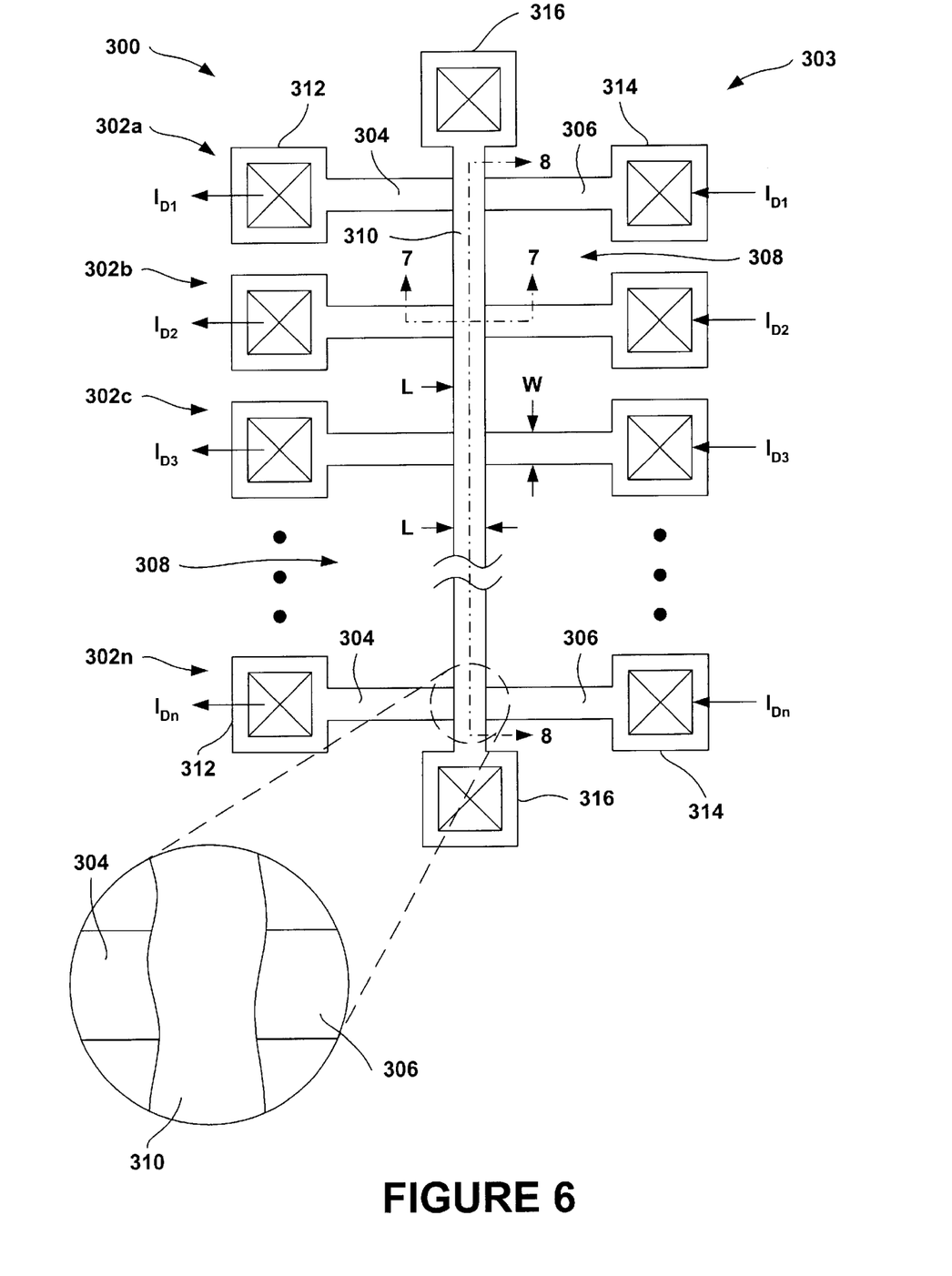
FIG. 6 is a plan view of a structure for determining the LER of a patterned feature according to the present invention.

Turning now to the Figures, FIG. 6 is a plan view illustrating a layout of a structure 300 for separating the LER of a patterned feature from other linewidth variation components. The structure 300 includes a plurality of transistors 302a–302n formed in a semiconductor substrate 303. Each transistor 302a–302n has a source region 304 and a drain region 306, respectively, and each of the transistors 302a–302n are electrically isolated from one another by isolation regions 308. In addition, each transistor 302a–302n has a gate electrode 310 which extends in a direction transverse to the source and drain regions 304 and 306. The gate electrode 310 is common with respect to the other transistors 302a–302n and each transistor 302a–302n has a source contact 312 and a drain contact 314 which are used to supply power to allow a current to conduct therethrough based upon the voltage of the gate electrode 310. Therefore each transistor 302a–302n may be connected to a power supply through a current meter or alternatively may form a portion of an integrated current detection circuit as may be desired. Similarly, the gate electrode 310 has one or more gate contacts 316 for supplying a control voltage to activate and deactivate the transistors 302a–302n, respectively. Since the gate electrode 310 is slightly resistive, multiple gate contacts 316 are preferred along the length of the gate 310 in order to ensure that each transistor 302a–302n has approximately the same control voltage applied thereto.

According to a preferred embodiment of the present invention, the common gate electrode 310 of FIG. 6 serves as the patterned feature of interest. Typically, the gate 310 is a patterned polysilicon layer, however, the gate 310 may alternatively be formed of metal or of another type of conductive material. The gate 310 has a linewidth "L" and is formed preferably by etching according to conventional semiconductor processing techniques, and has a LER (highlighted in the amplified portion) which varies the dimension of the linewidth "L" along its length. The LER is generated along the length of the gate electrode 310 due to various factors, as discussed supra. Each of the transistors 302a–302n has a width "W" which is preferably small to maximize the number of transistors along a given length of the gate electrode 310. Preferably, the number of transistors along a given length (i.e., the transistor density) is substantially greater than the spatial frequency of the LER in order to maximize the benefit of the present invention. With such a preferred transistor density, the number of collected data points for subsequent analysis will be more statistically meaningful, as will be described in greater detail infra. Generally, W will be substantially greater than L so that the LER associated with the width of the source and drain regions is not of great consequence. However, for analysis of LER having high spatial frequencies, W will be small and in such cases, the analysis may take into account the LER of the source/drain regions, as may be desired.

Figure 7:
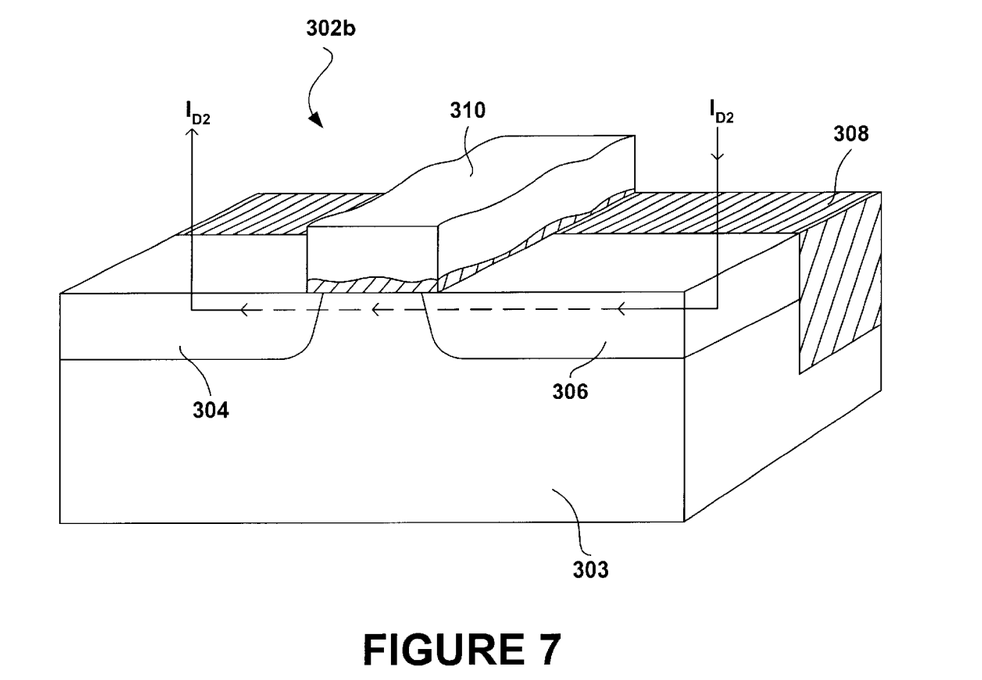
FIG. 7 is a sectional, perspective view taken along dotted line 7—7 of FIG. 6 according to the present invention.

FIG. 7 is a perspective, sectional view of a portion of the structure 300 of FIG. 6 taken along the dotted line 7—7 and illustrates a single transistor 302b. As can be seen in FIG. 7, the gate electrode 310 has an LER which causes the linewidth "L" of the gate to vary along its length. Note that in FIG. 7, the spatial frequency of the LER is high for the sake of illustration. Preferably, however, the transistor density is substantially greater than the spatial frequency of the LER so that the LER will not be detectable when viewing a single transistor such as the transistor 302b. Upon applying a control voltage on the gate electrode 310 which exceeds the transistor threshold voltage ($V_t$), the transistor 302b conducts and a drain current having a magnitude $I_{D2}$ passes therethrough from the drain 306 to the source 304 as illustrated. In saturation, the transistor 302b has a current magnitude as follows:

$$I_{D2}=(K/2)(V_G-V_t)^2,$$

wherein $V_G$ is the gate control voltage, $V_t$ is the transistor threshold voltage, and K is the device transconductance parameter and is defined as follows:

$$K=\mu_n C_{OX}(W/L),$$

wherein $\mu_n$ is the surface mobility of electrons in the transistor channel, $C_{OX}$ is the gate oxide capacitance per unit area, and (W/L) is the transistor dimension ratio. Please note that the above equations reflect a long-channel model of a transistor and are provided merely to illustrate that the transistor dimension ratio impacts the transistor drive current. It is understood, however, that most transistor structures are less than 0.5 micron devices and exhibit short-channel effects. Nevertheless, the transistor current in short-channel transistor models still are a function of the transistor dimension ratio.

As can be seen from the above equations, the transistor dimension ratio (W/L) has a direct impact upon transistor performance by varying the magnitude of the drain current for a given set of control parameters (i.e., $V_G$, $V_t$, $\mu_n$ and $C_{OX}$). Therefore the drain currents $I_{D1}$–$I_{Dn}$ for each of the transistors 302a–302n along the length of the common gate electrode 310 will vary due to the LER altering the transistor dimension ratios (W/L) due to the change in linewidth "L" for each transistor 302a–302n. Using this current magnitude variation, the LER of the patterned feature (i.e., the common gate electrode 310) can be deduced.

Figure 8:
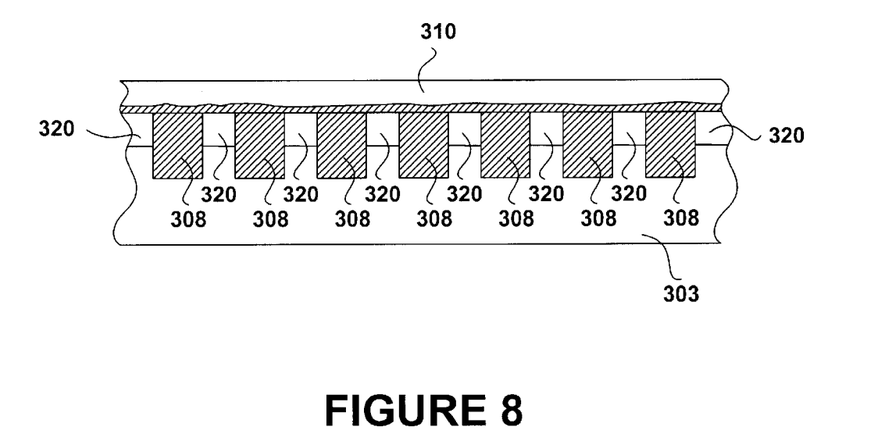
FIG. 8 is a sectional view taken along dotted line 8—8 of FIG. 6 according to the present invention.

FIG. 8 is a sectional view of a portion of the structure 300 of FIG. 6 taken along dotted line 8—8. The portion of structure 300 in FIG. 8 illustrates how each transistor 302a–302n is electrically isolated from one another via the isolation regions 308. According to a preferred embodiment of the present invention, the transistors 302a–302n of the structure 300 are isolated using a shallow trench isolation (STI) process to form the isolation regions 308. Alternatively, however, other isolation techniques may be utilized, such as a LOCOS process. Any isolation methodology may be used and any such isolation technique is contemplated as falling within the scope of the present invention. Because it is highly desirable to make the transistor density as high as possible, the isolation regions 308 will be made as thin as possible in order to maximize the packing density without sacrificing the individual device isolation.

Between each isolation region 308 in FIG. 8 is a transistor channel 320. The transistor channels 320 of FIG. 8 are illustrated as separate regions from the substrate 303 for ease of illustration, however, it should be understood that the channels 320 will be typically the substrate 303 or alternatively a well-type region within the substrate 303. The channel length of each channel 320 is dictated by the linewidth "L" of the overlying gate electrode 310 because the source and drain regions 304 and 306 are formed using the gate electrode 310 to self-align the regions. Therefore the channel length of each channel 320 is directly related to the linewidth "L" of the gate electrode 310 directly overlying that particular channel 320. Because each transistor 302a–302n has a unique transistor dimension ratio (W/L) due to the LER of the gate electrode 310, each transistor 302a–302n will have a unique conduction current associated therewith which is measured and forms a data set.

For a given set of data points, various statistical methods may be employed to characterize the data. For example, an average or a mean can be calculated from the data points, wherein each value provides different information regarding the data. Although the average or mean of the current magnitudes provide a piece of valuable information regarding the data set, the average or the mean does not indicate how close the various data points are to one another. For example, the data set {5, 10, 15} and {9, 10, 11} each have the same mean and the same average (i.e., x=AVG=10), however, the first data set has data points which are more widely scattered about the mean. Various ways of characterizing this characteristic of the data set exist, for example, through use of a variance or a standard deviation. According to a preferred embodiment of the present invention, the standard deviation is used to characterize the degree to which the measured conduction currents of the transistors 302a–302n vary about their mean value. The standard deviation (s) of the measured currents may be calculated according to the following formula:

$$s = [\Sigma(x_i - x)^2/(n-1)]^{1/2},$$

wherein x is the mean of the conduction currents and n is the number of transistors having conduction currents that are measured.

The average conduction current (i.e., $I_{AVG}=(I_{D1}+I_{D2}+\ldots+I_{Dn})/n$) is directly related to the average linewidth "L" of the common gate electrode 310. Since the designer knows the expected, nominal value of the gate linewidth "LNOM", the nominal conduction current ($I_{NOM}$) is also known. The difference between the nominal average conduction current and the measured average conduction current is thus attributable to linewidth variation components which do not include the LER of the feature 310. In contrast, the standard deviation of the conduction currents $I_{D1}$–$I_{Dn}$ reflect the amount to which the linewidth "L" of the gate electrode 310 varies about its mean value. Therefore the standard deviation reflects the LER of the gate 310 along its length.

Thus the structure 300 of the present invention allows one to distill the linewidth variation of a patterned feature due to LER from other linewidth variation components. In order to more accurately distill the LER variations from the other variation components, the transistors 302a–302n can be customized to minimize any transistor drive current contributions which are not directly due to the gate linewidth "L". For example, the doping concentration of the sources 304 and the drains 306 can be increased above typical levels. In addition, the transistors 302a–302n may be fabricated without sidewall spacers (as illustrated in FIGS. 6 and 7) on the lateral edges of the gate 310, which causes the underlying channel length to more directly reflect the shape of the gate electrode 310 at a given point. Consequently, in the above manner, the transistor conduction current may be made more sensitive to the channel length which is impacted by the LER. As is well known by those skilled in the art, the transistors 302a–302n may be further customized in a variety of ways in order to make the conduction current more sensitive to the LER and less sensitive to other process variables, and any such transistor customization is contemplated as falling within the scope of the present invention.

According to another aspect of the present invention, the present invention includes a method 400 of distilling LER from other non-LER linewidth variation components. In doing so, a process developer can determine the extent to which measured linewidth variations are due to LER or other non-LER process variables and focus on each issue accordingly. The method 400 is illustrated in the flow chart of FIG. 9. The method 400 begins at step 402 where a plurality of devices are formed using a common feature of interest within each device. According to a preferred embodiment of the present invention, the devices are transistors and the common feature of interest is a patterned gate electrode which is common to each of the transistors. Alternatively, however, other device structures may be constructed having a common feature of interest and such other devices are contemplated as falling within the scope of the present invention.

Figure 9:
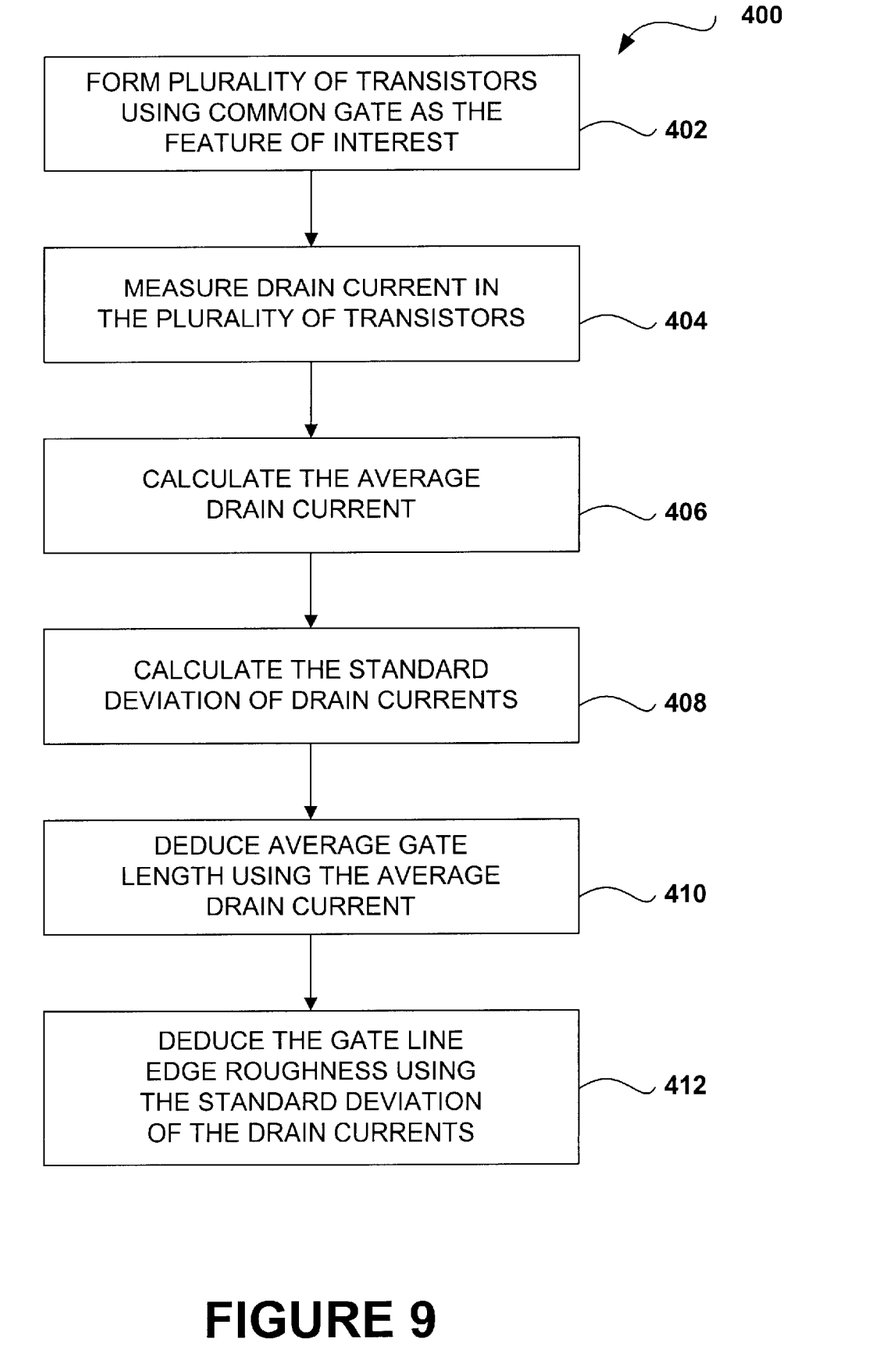
FIG. 9 is a flow chart illustrating a method of determining the LER of a patterned feature according to the present invention.

The method 400 continues at step 404, wherein a device performance parameter which is a function of the feature of interest is measured for each of the devices. Preferably, the device performance parameter is the conduction current for each of the transistors formed at step 402 since the conduction current is directly related to the linewidth of the common gate electrode. Using the measured device parameters as a data set, an average and a standard deviation of the set are calculated at steps 406 and 408, respectively. Preferably, the data set constitutes a plurality of transistor conduction currents and the average data value represents the average transistor current and the standard deviation data value constitutes the amount to which the transistor currents vary about their mean value.

Using the calculated average and standard deviation data values, the method deduces the LER from the non-LER linewidth variation components at steps 410 and 412, using the average data value to deduce the non-LER linewidth variation (step 410) and the standard deviation data value to deduce the LER (step 412).

Although the above invention has been shown and discussed with respect to a plurality of transistors forming the structure 300, it should be understood that the present invention contemplates other type structures in which multiple devices share a common feature of interest. For example, a plurality of capacitors may be formed in a semiconductor substrate, wherein the capacitors each share a common patterned electrode as the feature of interest. Since the capacitance of a capacitor is directly related to its area, the patterned common electrode can be characterized by measuring the average capacitance and the standard deviation of the capacitance of the various capacitors. Using these data values, the LER and the non-LER linewidth variation components of the common patterned electrode can be distilled. Likewise, other type device structures can be formed and similarly utilized in accordance with the present invention. Any such structure having a plurality of devices sharing a common patterned feature of interest is contemplated as falling within the scope of the present invention.

Another aspect of the present invention relates to a method of determining a device dimension specification based on a predetermined device performance repeatability criteria. In particular, the method provides an indication of how the LER impacts the transistor device performance repeatability and uses such information to identify a device dimension specification which will ensure a predetermined performance repeatability taking into account the LER.

According to an exemplary embodiment of the present invention, a plurality of test structures such as the structure 300 of FIG. 6 are formed on a substrate. The test structures 300 are preferably composed of a plurality of transistors 302a–302n including the common gate electrode 310 having an LER. Preferably, each of the test structures have transistors having a width dimension W which is substantially constant within a single test structure (so that the transistors each have substantially the same width dimension). In addition, the transistor width dimension between the various test structures varies so that, for example, test structure 1 has transistors with a width dimension $W_1$ and test structure 2 has transistors with a width dimension $W_2$, wherein $W_1 \neq W_2$.

The test structures 300 are then activated, for example, by applying a control voltage to each gate electrode 310, respectively, thus causing the transistors 302a–302n in each test structure to conduct. Each of the test structures may be activated simultaneously or at different times, as may be desired. Using the conduction currents, a standard deviation of the conduction currents (which is associated with the LER of the gate electrode 310) is calculated for each test structure, thus resulting in a plurality of standard deviations (e.g., $s_1, s_2, \ldots s_n$, for "n" test structures). Generally, the test structures having larger transistor widths will have a smaller standard deviation, while the test structures having smaller transistor widths will have larger standard deviations, as would be expected.

Thus the value of the standard deviations for each test structure will vary substantially linearly with regard to the transistor width dimension and will be substantially inversely proportional with respect thereto. Such a result makes intuitive sense because as a transistor width increases, the impact of the LER on the total conduction current will become attenuated. Therefore the standard deviations of the test structures reflect the extent to which the LER impacts the repeatability of transistors having different widths, thus coupling the LER to a device performance characteristic.

Once the standard deviations are calculated or otherwise determined, the standard deviations preferably are compared to a predetermined criteria (e.g., a desired performance repeatability) and one of the test structures is selected in response to the comparison. Preferably, the selected test structure represents a minimum transistor width dimension which will provide the desired repeatability performance despite the LER. In this manner, a device specification (e.g., the transistor width) can be identified which provides a desired performance repeatability level which takes into account the impact of the LER.

According to a preferred embodiment of the present invention, the gate electrode 310 is separate for each test structure. Alternatively, however, each test structure may share the same gate electrode, as may be desired. In addition, although the above method was discussed in conjunction with transistors, the present invention is equally applicable to other devices which have a performance which is impacted by LER. It is appreciated that the method may be extended to such devices and such alternatives are contemplated as falling within the scope of the present invention.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A structure for determining an amount of line edge roughness on a patterned feature, comprising:

a plurality of source regions and drain regions formed in a semiconductor substrate, each having a channel therebetween, wherein the source regions are electrically isolated from each other and the drain regions are electrically isolated from each other, respectively; and the patterned feature formed over a gate oxide and extending over the channels in a direction which is transverse to the source regions and the drain regions, wherein the patterned feature forms a common gate for a plurality of transistors formed with the plurality of source regions and drain regions, wherein the plurality of transistors are activated to conduct current therethrough by placing a predetermined voltage on the common gate, and wherein the currents through the plurality of transistors are used to determine the line edge roughness of the patterned feature which is the common gate.

2. The structure of claim 1, wherein the transistors exhibit a current having a magnitude which is substantially a function of a linewidth of the patterned feature, wherein the linewidth of the patterned feature defines a channel length of the transistors.

3. The structure of claim 1, wherein the currents of each of the plurality of transistors have a contribution associated with the linewidth of the patterned feature and a contribution associated with other transistor characteristics, and wherein the plurality of transistors are optimized to minimize the current contribution associated with the other transistor characteristics.

4. The structure of claim 3, wherein the plurality of transistors have the source regions and the drain regions self-aligned with respect to the patterned feature to minimize the current contribution associated with the other transistor characteristics.

5. The structure of claim 1, wherein the source regions are electrically isolated from one another and the drain regions are electrically isolated from one another by one of shallow trench isolation regions or LOCOS type isolation regions.

6. The structure of claim 1, wherein an average of the currents conducting through the plurality of transistors is associated with an average linewidth of the patterned feature.

7. The structure of claim 1, wherein a standard deviation of the currents conducting through the plurality of transistors is associated with the line edge roughness of the patterned feature.

8. A method of separating a line edge roughness of a patterned feature from one or more non-line edge roughness linewidth variation components of the patterned feature caused by other lithography process variables, comprising the steps of:

forming a plurality of transistors having a common gate electrode which forms the patterned feature;

measuring a conduction current in each of the plurality of transistors; and separating the line edge roughness from the non-line edge roughness linewidth variation components using the conduction currents.

9. The method of claim 8, wherein separating the line edge roughness from the non-line edge roughness linewidth variation components comprises determining the line edge roughness of the patterned feature using the conduction currents.

10. The method of claim 9, wherein determining the line edge roughness of the patterned feature comprises calculating a standard deviation of the conduction currents.

11. The method of claim 8, wherein separating the line edge roughness from the non-line edge roughness linewidth variation components comprises determining the non-line edge roughness linewidth variation components of the patterned feature using the conduction currents.

12. The method of claim 11, wherein determining the non-line edge roughness linewidth variation components comprises calculating an average conduction current of the conduction currents.

13. The method of claim 8, wherein a width of each of the plurality of transistors is less than a spatial frequency of the line edge roughness of the patterned feature.

14. A structure for determining an amount of line edge roughness on a patterned feature, comprising:

a plurality of devices formed in a semiconductor substrate, each being electrically isolated from each other and having a performance characteristic which is a function of the patterned feature; and the patterned feature formed on each of the plurality of devices and forming a common component in each of the plurality of devices, wherein the plurality of devices perform a desired function, and wherein the performance characteristic of each of the devices is used to determine the line edge roughness of the patterned feature.

15. The structure of claim 14, wherein a standard deviation of the performance characteristics of each of the devices is calculated and used to determine the line edge roughness of the patterned feature.

16. The structure of claim 14, wherein the plurality of devices comprise capacitors and the patterned feature comprises a common capacitor electrode for the capacitors.

17. The structure of claim 14, wherein the plurality of devices comprise transistors and the patterned feature comprises a common gate electrode for the transistors.

* * * * *

UNITED STATES PATENT AND TRADEMARK OFFICE
CERTIFICATE OF CORRECTION

PATENT NO. : 6,370,680 B1
DATED : April 9, 2002
INVENTOR(S) : Khanh B. Nguyen

It is certified that error appears in the above-identified patent and that said Letters Patent is hereby corrected as shown below:

<u>Column 2,</u>
Line 11, please replace the numeral "1 16" with the numeral -- 116 --.
Line 55, please replace the formula "4Xor 10X" with -- 4X or 10X --.

<u>Column 10,</u>
Line 16, please replace the word "LNOM" with -- $L_{NOM}$ --.

Signed and Sealed this

Eleventh Day of June, 2002

Attest:

Attesting Officer

JAMES E. ROGAN
*Director of the United States Patent and Trademark Office*